United States Patent
Sabathil et al.

(10) Patent No.: US 9,691,682 B2
(45) Date of Patent: Jun. 27, 2017

(54) OPTOELECTRONIC SEMICONDUCTOR COMPONENT HAVING AN ELECTRICALLY INSULATING ELEMENT

(71) Applicant: OSRAM Opto Semiconductors GmbH, Regensburg (DE)

(72) Inventors: Matthias Sabathil, Regensburg (DE); Stefan Illek, Donaustauf (DE); Thomas Schwarz, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 94 days.

(21) Appl. No.: 14/413,748

(22) PCT Filed: Jul. 16, 2013

(86) PCT No.: PCT/EP2013/064977
§ 371 (c)(1),
(2) Date: Apr. 23, 2015

(87) PCT Pub. No.: WO2014/016165
PCT Pub. Date: Jan. 30, 2014

(65) Prior Publication Data
US 2015/0235919 A1    Aug. 20, 2015

(30) Foreign Application Priority Data
Jul. 24, 2012  (DE) .................. 10 2012 212 968

(51) Int. Cl.
*H01L 31/0232*    (2014.01)
*H01L 23/373*    (2006.01)
(Continued)

(52) U.S. Cl.
CPC ........ *H01L 23/3731* (2013.01); *H01L 31/024* (2013.01); *H01L 33/642* (2013.01)

(58) Field of Classification Search
CPC . H01L 31/02327; H01L 21/486; H01L 24/96; H01L 23/49827; H01L 51/5246; H01L 2924/181; H01L 2924/12041
(Continued)

(56) References Cited

U.S. PATENT DOCUMENTS

2009/0218588 A1    9/2009  Panaccione et al.
2010/0096659 A1    4/2010  Noma
(Continued)

FOREIGN PATENT DOCUMENTS

DE    10 2008 011 153 A1    5/2009
DE    10 2009 036 621 A1    2/2011
EP         2 284 904 A1    2/2011

*Primary Examiner* — S. V. Clark
(74) *Attorney, Agent, or Firm* — DLA Piper LLP (US)

(57) ABSTRACT

An optoelectronic semiconductor component includes an optoelectronic thin-film chip; and a thermally conductive and electrically insulating element, wherein both the thin-film chip and the element are embedded in a molded body, a top surface of the thin-film chip and a bottom surface of the element are not covered by the molded body, the top surface of the thin-film chip is approximately flush with a top surface of the molded body, the bottom surface of the element is approximately flush with a bottom surface of the molded body, the molded body includes a first embedded conductor structure and a second embedded conductor structure, and the first conductor structure and the second conductor structure extends to the bottom surface of the molded body.

15 Claims, 4 Drawing Sheets

(51) Int. Cl.
*H01L 33/64* (2010.01)
*H01L 31/024* (2014.01)

(58) Field of Classification Search
USPC .... 257/81, 99, 100, 431, 432, 422, 787, 433
See application file for complete search history.

(56) References Cited

U.S. PATENT DOCUMENTS

| | | | |
|---|---|---|---|
| 2011/0062549 A1* | 3/2011 | Lin | H01L 23/3128 257/531 |
| 2012/0002420 A1 | 1/2012 | Imai et al. | |
| 2012/0074452 A1 | 3/2012 | Chan et al. | |
| 2015/0179616 A1* | 6/2015 | Lin | H01L 25/50 257/773 |
| 2015/0357274 A1* | 12/2015 | Choi | H01L 21/561 257/737 |
| 2016/0043047 A1* | 2/2016 | Shim | H01L 21/561 257/773 |
| 2016/0099387 A1* | 4/2016 | Tsutsui | H01L 24/97 257/98 |
| 2016/0118333 A1* | 4/2016 | Lin | H01L 25/50 257/773 |

\* cited by examiner

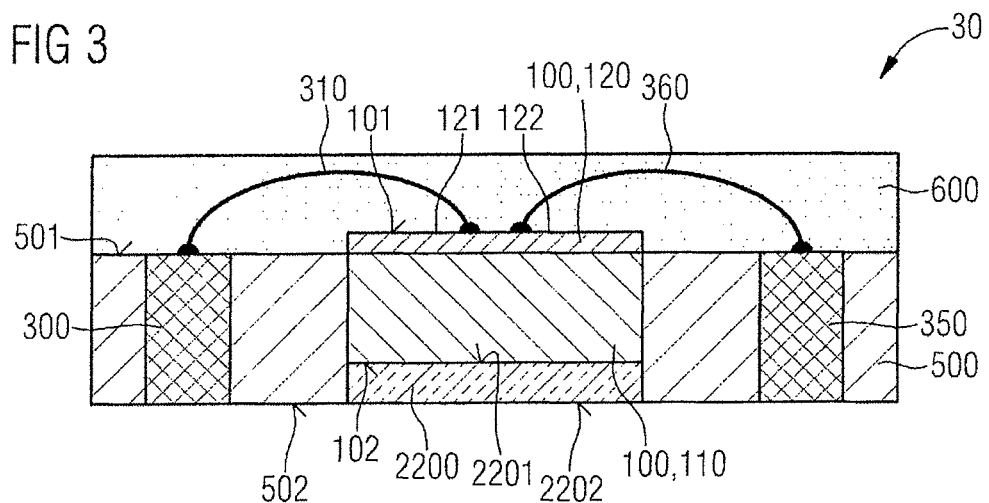
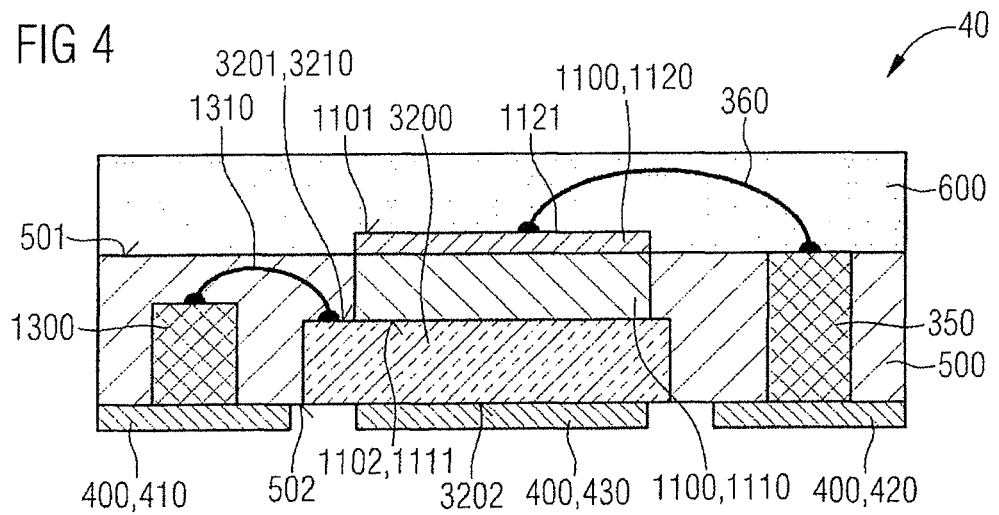

OPTOELECTRONIC SEMICONDUCTOR COMPONENT HAVING AN ELECTRICALLY INSULATING ELEMENT

TECHNICAL FIELD

This disclosure relates to an optoelectronic semiconductor component as well as to a method of manufacturing an optoelectronic semiconductor component.

BACKGROUND

DE 10 2009 036 621 A1 discloses a method of manufacturing an optoelectronic semiconductor component in which optoelectronic semiconductor chips are arranged on a top surface of a carrier. The optoelectronic semiconductor chips are surrounded by a molded body which covers all lateral surfaces of the optoelectronic semiconductor chips. Top and bottom surfaces of the optoelectronics semiconductor chips preferably remain uncovered. Upon removing the carrier, the optoelectronic semiconductor chips may be singularized. At the top and/or bottom surfaces of each semiconductor chip, contact points may be provided. The molded body may, e.g., consist of an epoxy-based mold material.

There is thus a need to provide an improved optoelectronic semiconductor component and an improved method of manufacturing an optoelectronic semiconductor component.

SUMMARY

We provide an optoelectronic semiconductor component including an optoelectronic thin-film chip; and a thermally conductive and electrically insulating element, wherein both the thin-film chip and the element are embedded in a molded body, a top surface of the thin-film chip and a bottom surface of the element are not covered by the molded body, the top surface of the thin-film chip is approximately flush with a top surface of the molded body, the bottom surface of the element is approximately flush with a bottom surface of the molded body, the molded body includes a first embedded conductor structure and a second embedded conductor structure, and the first conductor structure and the second conductor structure extends to the bottom surface of the molded body.

We also provide a method of manufacturing an optoelectronic semiconductor component, including providing an optoelectronic thin-film chip having top and bottom surfaces; thermally coupling the bottom surface to a thermally conductive and electrically insulating element; and embedding the thin-film chip and the element in a shared molded body such that a stop surface of the thin-film chip and a bottom surface of the element are not covered by the molded body, and the top surface of the thin-film chip is approximately flush with a top surface of the molded body, and the bottom surface of the element is approximately flush with a bottom surface of the molded body, wherein a first conductor structure and a second conductor structure are embedded in the molded body such that the first conductor structure and the second conductor structure extend to the bottom surface of the molded body.

BRIEF DESCRIPTION OF THE DRAWINGS

FIG. 3 depicts a sectional view through an optoelectronic semiconductor component according to a third example.

FIG. 4 depicts a sectional view through an optoelectronic semiconductor component according to a fourth example.

DETAILED DESCRIPTION

Figure 1:
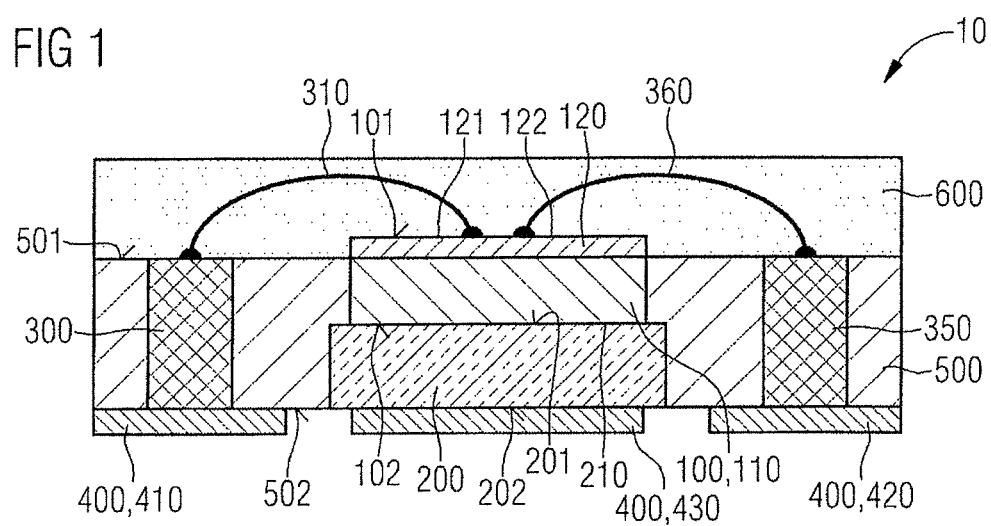
FIG. 1 shows a sectional view through an optoelectronic semiconductor component according to a first example.

Our optoelectronic semiconductor components comprise an optoelectronic thin-film chip and a thermally conductive and electrically isolating element. In this context, both the thin-film chip and the element are embedded in a molded body. Preferably, the thermally conductive and electrically insulating element causes an electric insulation towards the assembly face of the optoelectronic semiconductor component. This advantageously configures the optoelectronic thin-film chip with an electrically conductive carrier. Preferably, a material having a well-adjusted thermal expansion coefficient may then be selected for the carrier of the optoelectronic thin-film chip, thus resulting in reduced fragility.

A top surface of the thin-film chip and a bottom surface of the element need not be covered by the molded body. Advantageously, the top surface of the thin-film chip may then form a radiation-discharge surface of the optoelectronic semiconductor component. The bottom surface of the element may advantageously discharge heat produced by the optoelectronic semiconductor component.

A solderable thermal contact pad may be arranged at the bottom surface of the element. Advantageously, a thermal junction of the optoelectronic semiconductor component may, e.g., be carried out by reflow soldering.

The molded body may comprise a first embedded conductor structure and a second embedded conductor structure. Advantageously, the embedded conductor structures may serve as electrical ducts.

Two solderable electrical contact pads may be arranged at the bottom surface of the semiconductor component and connected to the embedded conductor structures in an electrically conductive manner. Advantageously, the optoelectronic semiconductor component is then an SMD component which may, e.g., be contacted by reflow soldering.

The thin-film chip may comprise two electrical bond pads arranged on its top surface, each bond pad connected to one of the conductor structures by a bond wire. Advantageously, the electrical contacts of the thin-film chip arranged on the top surface of the optoelectronic semiconductor component may subsequently be contacted at the bottom surface of the semiconductor component.

The element may be configured as a ceramic plate. Advantageously, an element configured as a ceramic plate has a high thermal conductivity and good electrically insulating properties and may thus be obtained inexpensively.

The element may comprise an electrical through contact. Advantageously, in this optoelectronic semiconductor component the optoelectronic thin-film chip may comprise an electrical contact at its bottom surface facing the element.

This advantageously configures the optoelectronic semiconductor component with a conventional optoelectronic thin-film chip.

The thin-film chip may comprise an electrical contact arranged at its bottom surface, an electrically conductive layer being arranged on a top surface of the element, the element being connected to the contact in an electrically conductive manner. The electrically conductive layer connects to one of the conductor structures in an electrically conductive manner. Advantageously, in this optoelectronic semiconductor component, as well, the thin-film chip may be configured as a conventional thin-film chip with an electrical contact arranged on the bottom surface of the thin-film chip. This allows for inexpensive manufacture of the optoelectronic semiconductor component.

The electrically conductive layer may connect to one of the conductor structures by a bond wire embedded in the molded body. Advantageously, configuring the electrical connection as a bond connection is possible in an inexpensive manner.

The thin-film chip and the element may abut each other in a thermally conductive manner. As a result, a good thermal conductivity is then advantageously guaranteed between the thin-film chip and the element.

Our methods of manufacturing an optoelectronic semiconductor component comprise steps of providing an optoelectronic thin-film chip having a top and a bottom surface to thermally couple the bottom surface to a thermally conductive and electrically insulating element and embed the thin-film chip and the element into a shared molded body. Advantageously, an optoelectronic thin-film chip having an electrically conductive carrier may be used for this method. A further advantage is that it allows for a simple thermal coupling of the bottom surface of the thin-film chip to the element since the coupling does not have to be mechanically stable. Advantageously, the thin-film chip and the element are fixed relatively with regard to each other by the molded body. A further advantage is that when placing the thin-film chip and the element relative to each other, there are no high demands with regard to precise placement, which allows for an inexpensive process.

A plurality of optoelectronic thin-film chips, each thermally coupled to a thermally conductive and electrically insulating element, may at the same time be embedded into a shared molded body. Advantageously, the method allows for parallel manufacture of a plurality of optoelectronic semiconductor components, thus reducing the costs of manufacturing an optoelectronic semiconductor component.

A first conductor structure may additionally be embedded into the molded body. Herein, a step of manufacturing a bond connection between a bond pad arranged on the upper surface of the thin-film chip and the first conductor structure is carried out upon embedding. Advantageously, the conductor structure thus configures an electric connection of the bond pad arranged on the upper surface of the thin-film chip to the bottom surface of the optoelectronic semiconductor component.

A further step of depositing a metallization on a bottom surface of the molded body may be carried out upon embedding. Advantageously, the optoelectronic semiconductor component thus manufactured may then be electrically contacted as an SMD component by reflow soldering. Advantageously, depositing the metallization may be carried out without photolithographic structuring techniques, allowing for an inexpensive execution of the method.

The element may comprise a plurality of particles having an average diameter of less than 100 µm, the particles being arranged on the bottom surface of the thin-film chip by electrophoretic deposition. Advantageously, this method inexpensively manufactures the optoelectronic semiconductor component.

The element may be arranged at the bottom surface of the thin-film chip prior to separating the thin-film chip from a plurality of further similar thin-film chips. Advantageously, arranging the element on the bottom surface of the thin-film chip is carried out when the thin-film chips are still at wafer level, thus simultaneously arranging thermally conductive and electrically insulating elements at a plurality of thin-film chips. Hereby, the manufacturing costs are reduced in an advantageous manner.

An electrically conductive layer may be arranged on a top surface of the element facing the bottom surface of the thin-film chip. In this context, a second conductor structure is additionally embedded into the molded body. Moreover, a step of producing a bond connection between the electrically conductive layer and the second conductor structure is carried out prior to embedding. Advantageously, the method then uses a thin-film chip with a contact arranged on its bottom surface, thus allowing for the use of a conventional thin-film chip. Thus, the method may be carried out inexpensively.

The thin-film chip may be embedded into a first molded body. In this context, the element is embedded into a second molded body. Subsequently, the first molded body and the second molded body are merged to form a shared molded body. Advantageously, a contacting of the thin-film chips may in this method be carried out simultaneously for a plurality of semiconductor components to be manufactured, thus reducing the manufacturing costs per optoelectronic semiconductor component.

The above-described properties, features and advantages as well as the manner in which they are achieved will become clearer in context with the following description of examples described in more detail in conjunction with the accompanying drawings.

FIG. 1 shows a schematic view of a section through an optoelectronic semiconductor component 10 according to a first example. The optoelectronic semiconductor component 10 may, e.g., be a LED package. The optoelectronic semiconductor component 10 may particularly be an SMD-capable semiconductor component.

The optoelectronic semiconductor component 10 comprises a thin-film chip 100. The thin-film 100 is preferably an optoelectronic thin-film chip. The thin-film chip 100 may, e.g., be an LED chip.

The thin-film chip 100 comprises a substrate 110 and an EPI layer 120 arranged on the substrate 110. The substrate 110 may be an electrically insulating or an electrically conductive substrate. The substrate 110 may, e.g., comprise silicon or germanium. The EPI layer 120 is produced by epitactic growth. Preferably, the EPI layer 120 was epitactically grown on a carrier not shown in FIG. 1 and not arranged on the substrate 110 until later. Preferably, the thermal expansion coefficient of the substrate 110 is adapted to the thermal expansion coefficient of the EPI layer 120. The possibility of configuring the substrate 110 in an electrically conductive as well as in an electrically insulating manner facilitates choosing the substrate material from a wide range of possible materials. Thus, a good thermal adaption may be carried out between the substrate 110 and the EPI layer 120.

A surface of the EPI layer 120 facing away from the substrate 110 forms an upper surface 101 of the thin-film chip 100. A surface of the substrate 110 facing away from the EPI layer 120 forms the bottom surface 102 of the thin-film chip 100. The upper surface 101 of the thin-film chip 100 is preferably a radiation-discharge face of the thin-film chip 100.

A first bond pad (bonding area for wire bonding) 121 and a second bond pad 122 are arranged on the top surface 101 of the thin-film chip 100. The first bond pad 121 and the second bond pad 122 form electrical contacts of the thin-film chip 100. Thus, both electrical contacts of the thin-film chip 100 are arranged on the top surface 101 of the thin-film chip 100.

The optoelectronic semiconductor component 10 furthermore comprises an insulating plate 200 having a top surface 201 and a bottom surface 202. The insulating plate 200 consists of an electrically insulating material having good thermal conductivity. Preferably, the insulating plate 200 comprises a ceramic material. For example, the insulating plate 200 may be made of AlN, SiN or of a hybrid material consisting of a mold material and a suitable filling material.

The top surface of the insulating plate 200 faces the bottom surface 102 of the thin-film chip 100 and is in contact therewith. In this context, the relative lateral placing of the thin-film chip 100 and the insulating plate 200 does not have to be particularly precise. A thermal junction 210 exists between the top surface 201 of the insulating plate 200 and the bottom surface 102 of the thin-film chip 100. The thermal junction 210 may have been produced by gluing, sintering or pressing. The thermal junction 210 guarantees a good thermal conductivity between the thin-film chip 200 and the insulating plate 200. However, the thermal junction 210 is not required to provide a particularly robust mechanical connection.

The thin-film chip 100 and the insulating plate 200 are embedded in a shared molded body 500. The molded body 500 is electrically insulating and preferably consists of a mold material. Embedding the thin-film chip 100 and the insulating plate 200 into the molded body 500 is preferably carried out by a molding process, e.g., by foil-assisted transfer molding.

The molded body 500 comprises a top surface 501 and a bottom surface 502. Preferably, the top surface 101 of the thin-film chip 100 is not covered by the molded body 500. Moreover, the bottom surface 202 of the insulating plate 200 is preferably not covered by the molded body 500, either. Preferably, the top surface 101 of the thin-film chip 100 is approximately flush with the top surface 501 of the molded body. Also, the bottom surface 202 of the insulating plate 200 is approximately flush with the bottom surface 502 of the molded body 500.

The molded body 500 fixes the insulating plate 200 relative to the thin-film chip 100. For this reason, the thermal junction 210 between the insulating plate 200 and the thin-film chip 100 does not have to be mechanically stable. The mechanical stability of the thermal junction 210 merely has to be sufficient enough to keep the insulating plate 200 at the thin-film chip 100 during manufacture of the molded body 500.

When embedding the thin-film chip 100 and the insulating plate 200 into the molded body 500, a plurality of further thin-film chips 100 and insulating plates 200 preferably have been embedded into the same molded body 500. In a later method step, the molded body 500 may be broken up into individual smaller molded bodies, each at least comprising a thin-film chip 100 and at least one insulating plate 200.

The optoelectronic semiconductor component 10 moreover comprises a first conductor structure 300 and a second conductor structure 350. The first conductor structure 300 and the second conductor structure 350 comprise an electrically conductive material, e.g., pieces of a printed circuit board or conductive silicon. The first conductor structure 300 and the second conductor structure 350 are also embedded into the molded body 500 and each form an electrical through-contact between the top surface 501 and the bottom surface 502 of the molded body 500.

The first bond pad 121 on the top surface 101 of the thin-film chip 100 connects to the first conductor structure 300 by a first bond wire 310 in an electrically conductive manner. The second bond pad 122 on the top surface 101 of the thin-film chip 100 connects to the second conductor structure 350 by a second bond wire 360 in an electrically conductive manner. The first and second bond wire 310, 360 extend above the top surface 501 of the molded body 500 outside of the molded body 500. Preferably, the first bond wire 310 and the second bond wire 360 have been arranged at the molded body 500 after embedding the thin-film chip 100, the insulating plate 200 and the conductor structures 300, 350. Preferably, the first bond wire 310 and the second bond wire 360 have been arranged at further thin-film chips 100 embedded into the molded body 500 by further bond wires in a shared method step before the embedded thin-film chips 100 were separated from one another.

A luminescent layer 600 is arranged on the top surface 501 of the molded body 500. The luminescent layer 600 may, e.g., consist of silicone with embedded phosphorus. The luminescent layer 600 may convert a wavelength of radiation emitted through the top surface 101 of the thin-film chip 100. The bond wires 301, 360 are embedded into the luminescent layer 600. Preferably, the luminescent layer 600 has been deposited on the top surface 501 of the molded body 500 only after attaching the bond wires 310, 360. In a simplified example of the optoelectronic semiconductor component 10, the luminescent layer 600 may also be omitted.

A metallization 400 is arranged on the bottom surface 502 of the molded body 500 of the optoelectronic semiconductor component 10. The metallization 400 may, e.g., comprise copper, aluminum or gold. The metallization 400 may have been deposited on the bottom surface 502 of the molded body 500, e.g., by galvanic deposition or lamination. Advantageously, photolithographic structuring techniques were not required to deposit the metallization 400. The metallization 400 has preferably been deposited before the molded body 500 of the optoelectronic semiconductor component 10 was separated from the molded bodies 500 of further optoelectronic semiconductor components 10. In a simplified example of the optoelectronic semiconductor component 10, the metallization may, however, be omitted.

The metallization 400 comprises a first electrical contact pad 410, a second electrical contact pad 420 and a thermal contact pad 430. The electrical contact pads 410, 420 and the thermal contact pad 430 are electrically insulated from one another. The first electrical contact pad 410 is arranged in the area at the bottom surface 502 of the molded body 500 where the first conductor structure 300 ends. Thus, the first electrical contact pad 410 connects to the first conductor structure 300 in an electrically conductive manner. The second electrical contact pad 420 connects to the second conductor structure 350 in an electrically conductive manner. The thermal contact pad 430 connects to the bottom surface 202 of the insulating plate 200 in a thermally conductive manner.

The first electrical contact pad 410, the second electrical contact pad 420 and the thermal contact pad 430 of the metallization 400 are SMD-capable contact pads suitable to produce a junction by reflow soldering. The thin-film chip 100 may be electrically contacted via the first electrical contact pad 410 and the second electrical contact pad 420. Electric current may then flow via the contact pads 410, 420, the conductor structures 300, 350, the bond wires 310, 360 and the bond pads 121, 122. The heat generated by the thin-film chip 100 may be discharged via the thermal contact pad 430. The head flows from the thin-film chip 100 to the thermal contact pad 430 via the insulating plate 200.

Figure 2:
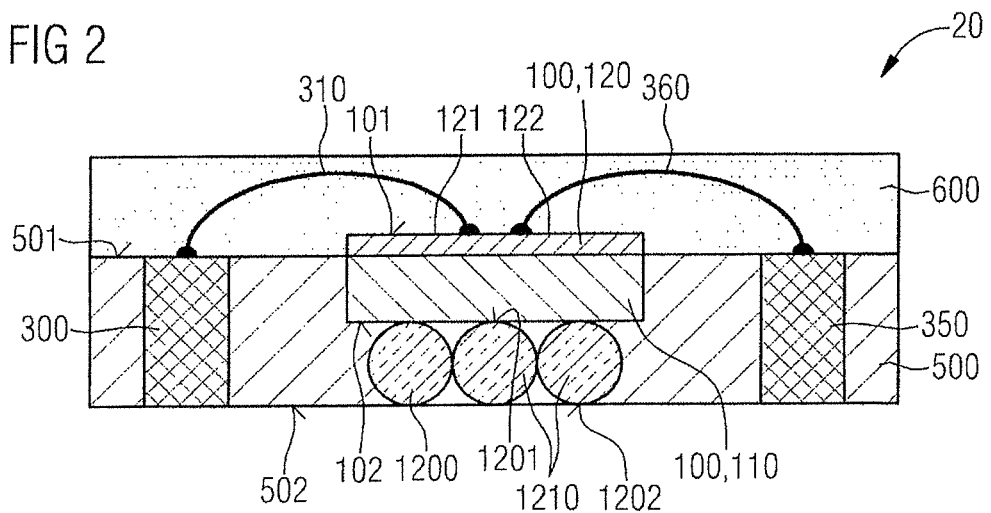
FIG. 2 depicts a sectional view through an optoelectronic semiconductor component according to a second example.

FIG. 2 shows a schematic view of an optoelectronic semiconductor component 20 according to a second example. The optoelectronic semiconductor component 20 is very similar to the optoelectronic semiconductor component 10 of FIG. 1. Similar or equivalent components have been assigned the same reference numerals and will not be described in detail below. The steps necessary to manufacture the optoelectronic semiconductor component 20 are only described insofar as they differ from the method of manufacturing the optoelectronic semiconductor component 10.

Instead of the insulating plate 200, the optoelectronic semiconductor component 20 comprises an insulating element 1200. The insulating element 1200 comprises a plurality of particles 1210. The particles 1210 preferably comprise an average size of less than 100 µm. Particularly preferably, the average size of the particles 1210 is 10 µm to 50 µm. The particles 1210 of the insulating element 1200 may, e.g., consist of a ceramic material. The particles 1210 may, e.g., consist of the same material as the insulating plate 200 of the optoelectronic semiconductor component 10 of FIG. 1.

The insulating element 1200 formed from the particles 1210 has a top surface 1201 and a bottom surface 1202. The top surface 1201 of the insulating element 1200 faces the bottom surface 102 of the thin-film chip 100 and is in good thermal contact therewith. The bottom surface 1202 of the insulating element 1200 is not covered by the molded body 500 and preferably flush with the bottom surface 502 of the molded body 500.

The particles 1210 have preferably been deposited on the bottom surface 102 of the thin-film chip 100 immediately upon manufacture. Preferably, the thin-film chip 100 was still on wafer level with a plurality of similar thin-film chips 100 when the particles 1210 were deposited on the bottom surface 102 of the thin-film chip 100. The particles 1210 may, e.g., have been deposited on the bottom surface of the thin-film chip 100 by electrophoretic deposition. Subsequently, the particles 1210 deposited on the bottom surface of the thin-film chip 100 were fixed by a concordant deposition method (e.g., atomic layer deposition ALD or by parylene) and thermally connected in an improved way. Only then have the thin-film chips 100 on wafer level been separated from one another.

By embedding the thin-film chip 100 and the insulating element 1200 formed from the particles 1210 into the mold 500, gaps between the particles 1210 of the insulating element 1200 have been filled by the molded body 500 and the mechanical stability of the insulating element 1200 formed from the particles 1210 were increased. Subsequently, the bottom surface 1202 of the insulating element 1200 formed from the particles 1210 may have been ground to leave a sufficiently large thermal contact pad to the insulating element 1200 on the bottom surface 1202 of the insulating element 1200.

In the optoelectronic semiconductor component 20 shown in FIG. 2, no metallization is arranged on the bottom surface 502 of the molded body 500. Such a metallization 400, however, may be provided as in the optoelectronic semiconductor component 10 of FIG. 1.

FIG. 3 shows a schematic view of a section through an optoelectronic semiconductor component 30 according to a third example. The optoelectronic semiconductor component 30 is similar to the optoelectronic semiconductor component 20 of FIG. 2. Similar or equivalent components have been assigned the same reference numerals and will not be described in detail below. The steps necessary to manufacture the optoelectronic semiconductor component 30 are only described insofar as they differ from the method of manufacturing the optoelectronic semiconductor component 20.

Instead of the insulating element 1200, the optoelectronic semiconductor component 30 comprises an insulating layer 2200. The insulating layer 2200 comprises an electrically insulating and thermally conductive dielectric. For example, the dielectric of the insulating layer 1200 may be ceramic particles in an organic matrix. Bergquist HPL is an example of a suitable commercially available product. In this case, the insulating layer 2200, e.g., comprises a specific heat conductivity of 3 W/mK. To guarantee an avalanche voltage of the insulating layer 2200 of more than 1200 V, the insulating layer 2200 should have a thickness of at least 38 µm.

The insulating layer 2200 has a top surface 2201 and a bottom surface 2202. The top surface 2201 faces the bottom surface 102 of the thin-film chip 100 and is in good thermal contact therewith. The bottom surface 2202 is preferably not covered by the molded body 500 but lies flush with the bottom surface 502 of the molded body 500.

The insulating layer 1200 may have been deposited on the bottom surface 102 of the thin-film chip 100 in a liquid or solid state. Preferably, the insulating layer 1200 has been deposited on the bottom surface 102 of the thin-film chip 100 with the thin-film chip 100 still on wafer level with a plurality of further thin-film chips 100. The insulating layer 2200 may have been deposited on the bottom surface of the thin-film chip 100, e.g., by casting across the entire layer and subsequent laser structuring or by screen or stencil printing.

The optoelectronic semiconductor component 30, as well, may comprise a metallization 400 at the bottom surface of the molded body 500.

FIG. 4 is a schematic view of a section through an optoelectronic semiconductor component 40 according to a fourth example. The optoelectronic semiconductor component 40 is similar to the optoelectronic semiconductor component 10 of FIG. 1. Similar or equivalent components have been assigned the same reference numerals and will not be described in detail below. The steps necessary to manufacture the optoelectronic semiconductor component 40 are only described insofar as they differ from the method of manufacturing the optoelectronic semiconductor component 10.

Instead of the thin-film chip 100, the optoelectronic semiconductor component 40 comprises a thin-film chip 1100. The thin-film chip 1100 also comprises a substrate 1110 and an EPI layer 1120 arranged on a surface of the substrate 1110. The substrate 1110 may in turn consist of a conductive or of an electrically insulating material. The substrate 1110 is preferably thermally adjusted to the EPI layer 1120. The EPI layer 1120 is an epitactically grown layer preferably deposited on the substrate 1110 upon manufacture. A surface of the EPI layer 1120 facing away from the substrate 1110 forms a top surface 1101 of the thin-film chip 1100. A surface of the substrate 1110 facing away from the EPI layer 1120 forms a bottom surface 1102 of the thin-film chip 1100. The thin-film chip 1100 may, e.g., be an LED chip. In this case, the top surface 1101 of the thin-film chip 1100 is preferably a radiation-discharge layer of the thin-film chip 1100.

Contrary to the thin-film chip 100 of FIG. 1, the thin-film chip 1100 of the optoelectronic semiconductor component 40 only comprises one bond pad 1121 on its top surface 1101. A further electrical contact 1111 of the thin-film chip 1100 is arranged on the bottom surface 1102 of the thin-film chip 1100.

Instead of the insulating plate 200, an insulating plate 3200 is provided in the optoelectronic semiconductor component 40. The insulating plate 3200 comprises an electrically insulating and thermally conductive material, e.g., the same material as the insulating plate 200 of FIG. 1. The insulating plate 3200 comprises a top surface 3201 and a bottom surface 3202. The top surface 3201 of the insulating plate 3200 faces the thin-film chip 1100 and is in good thermal contact with the bottom surface 1102 of the thin-film chip 1100. The bottom surface 3202 of the insulating plate 3200 lies flush with the bottom surface 502 of the molded body 500.

The insulating plate 3200 has a larger lateral extension than the thin-film chip 1100. As a result, the top surface 3201 of the insulating plate 3200 overlaps the bottom surface 1102 of the thin-film chip 1100. On the top surface 3201 of the insulating plate 3200, an electrically conductive layer 3210 connects to the electrical contact 1111 on the bottom surface 1102 of the thin-film chip 1100 in an electrically conductive manner. The electrically conductive layer 3210 is in this context configured as a bondable layer. The electrically conductive 3210 layer may, e.g., be a metallic layer.

Instead of the first conductor structure 300, a shortened conductor structure 1300 is provided in the optoelectronic semiconductor component 40. The shortened conductor structure 1300 comprises an electrically conductive material, e.g., the same material as the first conductor structure 300. The shortened conductor structure 1300 does not extend over the entire height of the molded body 500. The shortened conductor structure 1300 extends from the bottom surface 502 of the molded body 500 up to a section of the molded body 500 arranged between the top surface 501 and the bottom surface 502 of the molded body 500. The length of the shortened conductor structure 1300 preferably corresponds to approximately the thickness of the insulating plate 3200 between its top surface 3201 and its bottom surface 3202.

The electrically conductive layer 3210 on the top surface 3201 of the insulating plate 3200 connects to the shortened conductor structure 1300 in an electrically conductive manner via a bond wire 1310. Since the electrically conductive layer 3210 also connects to the electrical contact 1111 at the bottom surface 1102 of the thin-film chip 1100 in an electrically conductive manner, an electrically conductive connection exists between the electrically conductive contact 1111 of the thin-film chip 1100 and the end of the shortened conductor structure 1300 at the bottom surface 502 of the molded body 500.

The bond wire 1310 is embedded into the molded body 500. Preferably, the insulating plate 3200 and the shortened conductor structure 1300 were at first arranged on a sheet of a device for foil-assisted transfer molding. At this point in time, the thin-film chip 1100 and the second conductor structure 350 may already have been arranged on the insulating plate 3200 or, respectively, on the sheet, as well. Subsequently, the bond wire 1310 has been applied between the electrically conductive layer 3210 and the shortened conductor structure 1300. Only then have the insulating plate 3200, the thin-film chip 1100, the shortened conductor structure 1300, the second conductor structure 350 and the bond wire 1310 been embedded into the molded body 500. Subsequently, the bond pad 1121 located on the top surface 1101 of the thin-film chip 1100 connects to the second conductor structure 350 by the second bond wire 360.

On the bottom surface 502 of the molded body 500 of the optoelectronic semiconductor component 40, the depicted example again shows a metallization 400 with a first contact pad 410, a second contact pad 420 and a thermal contact pad 430. The first electrical contact pad 410 provides a solderable connection to the shortened conductor structure 1300. The second electrical contact pad 420 provides a solderable electrical junction to the second conductor structure 350. The thermal contact pad 430 provides a solderable thermal junction to the insulating plate 3200. The metallization 400 may be omitted in a simplified example of the optoelectronic semiconductor component 40.

In a variant of the optoelectronic semiconductor component 40 not explicitly shown in FIG. 4, the insulating plate 3200 comprises an electrical through-contact which generates an electrically conductive connection between the top surface 3201 and the bottom surface 3202 of the otherwise electrically insulating plate 3200. In this variant, the through-contact in the insulating plate 3200 provides an electrically conductive connection between the electrical contact 1111 at the bottom surface 1102 of the thin-film chip 1100 and the first electrical contact pad 410. The shortened conductor structure 1300 and the bond wire 1310 may be omitted in this variant. Thus, the bonding process of applying the bond wire 1310 required prior to producing the molded body 500 is omitted as well.

Figure 5:
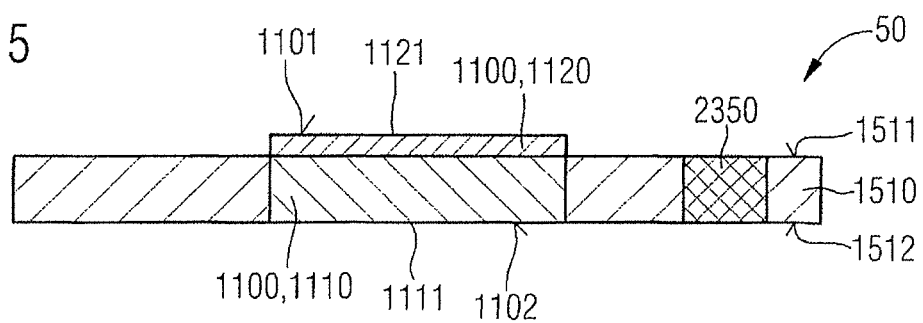
FIG. 5 shows a sectional view through a first part of an optoelectronic semiconductor component according to a fifth example.

FIG. 5 shows a schematic view of a section through a first part of an optoelectronic semiconductor component 50 according to a fifth example. The optoelectronic semiconductor component 50 is similar to the optoelectronic semiconductor component 40 of FIG. 4. Similar or equivalent components have been assigned the same reference numerals and will not be described in detail below. The steps necessary to manufacture the optoelectronic semiconductor component 50 are only described insofar as they differ from the method of manufacturing the optoelectronic semiconductor component 40.

The optoelectronic semiconductor component 50, as well, comprises a thin-film chip 1100 having only one bond pad 1121 arranged on the top surface 1101 and an electrical contact 1111 arranged on the bottom surface 1102 of the thin-film chip 1100. The thin-film chip 1100 is embedded in an upper molded body 1510. The upper molded body 1510 comprises a top surface 1511 and a bottom surface 1512. The top surface 1101 of the thin-film chip 1100 is approximately flush with the top surface 1511 of the upper molded body 1510. The bottom surface 1102 of the thin-film chip 1100 is approximately flush with the bottom surface 1512 of the upper molded body 1510. The molded body 1510 consists of the same material as molded body 500 of the above-described examples and has preferably been manufactured by foil-assisted transfer molding as well.

In the upper molded body 1510 of the optoelectronic semiconductor component 50, an upper conductor structure 2350 is additionally embedded. The upper conductor structure 2350, like the second conductor structure 350, comprises an electrically conductive material. The upper conductor structure 2350 extends between the top surface 1511 and the bottom surface 1512 of the upper molded body 1510.

Figure 6:
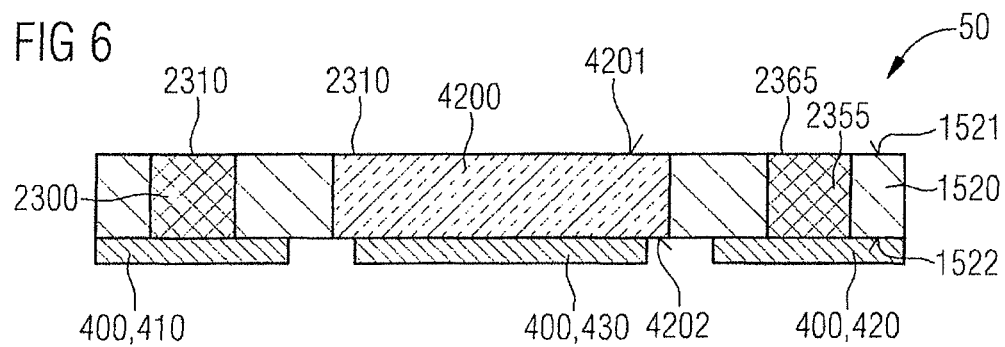
FIG. 6 shows a sectional view through a second part of an optoelectronic semiconductor component according to the fifth example.

FIG. 6 shows a schematic view of a section through the second part of the optoelectronic semiconductor component 50. Instead of an insulating plate 3200, the optoelectronic semiconductor component 50 comprises an insulating plate 4200. The insulating plate 4200 comprises a top surface 4201 and a bottom surface 4202. The insulating plate 4200 comprises an electrically insulating and thermally conductive material, e.g., a ceramic material. The insulating plate 4200 may consist of the same material as the insulating plate 3200.

The insulating plate 4200 is embedded in a bottom molded body 1520. The bottom molded body 1520 comprises a top surface 1521 and a bottom surface 1522. The top surface 4201 of the insulating plate 4200 lies flush with the upper surface 1521 of the bottom molded body 1520. The bottom surface 4202 of the insulating plate 4200 lies flush with the bottom surface 1522 of the bottom molded body 1520. The bottom molded body 1520 consists of the same material as the upper molded body 1510 and has preferably been manufactured by foil-assisted transfer molding, as well.

The optoelectronic semiconductor component 50 additionally comprises a first bottom conductor structure 2300 embedded in the bottom molded body 1520. The first bottom conductor structure 1200 comprises an electrically conductive material and extends between the top surface 1521 and the bottom surface 1522 of the bottom molded body 1520. Moreover, a second bottom conductor structure 2355 is embedded into the molded body 1520 of the optoelectronic semiconductor component 50. The second bottom conductor structure 2355 comprises an electrically conductive material as well, and extends between the top surface 1521 and the bottom surface 1522 of the bottom molded body 1520.

At the top surface 1521 of the bottom molded body 1520, an electrically conductive wiring structure 2310 connects to the first bottom conductor structure 2300 in an electrically conductive manner and extends over at least a section of the top surface 4201 of the insulating plate 4200. Furthermore, a conductive connection 2365 is arranged on the top surface 1521 of the bottom molded body 1520 connected to the second bottom conductor structure 2355 in an electrically conductive manner. The wiring structure 2310 and the conductive connection 2360 may, e.g., comprise metal and may have been deposited, e.g., by galvanic deposition or lamination. The demands to the precision of alignment when arranging the wiring structure 1310 and the conductive connection 2365 are in this context rather low.

At the bottom surface 1522 of the bottom molded body 1520, a metallization 400 is again arranged. A first electrical contact pad 410 of the metallization 400 provides a solderable electrically conductive connection to the first bottom conductor structure 2300. A second electrical contact pad 420 provides a solderable electrically conductive connection to the second bottom conductor structure 2355. A thermal contact pad 430 provides a solderable and thermally conductive connection to the bottom surface 4202 of the insulating plate 4200. In a simplified example of the optoelectronic semiconductor component 50, the metallization 400 may be omitted.

Figure 7:
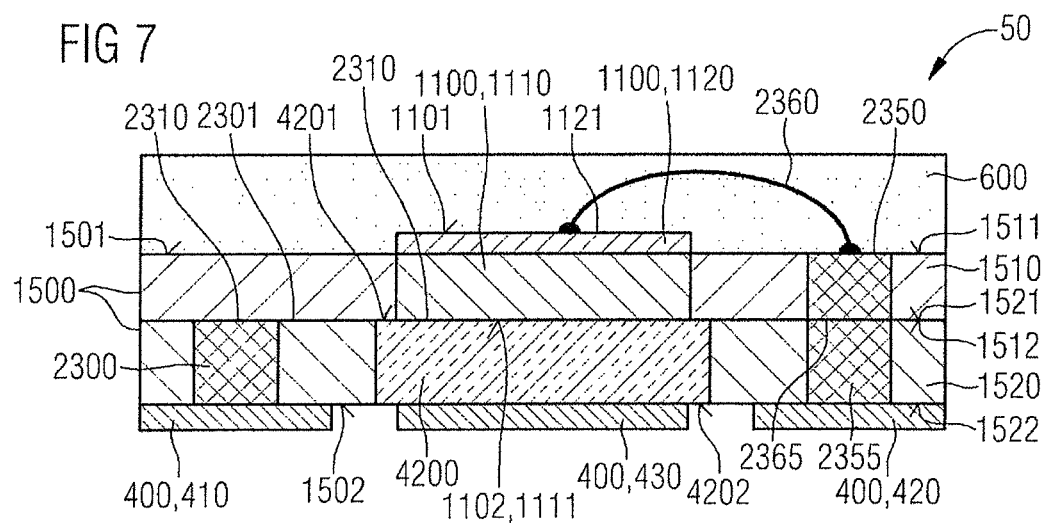
FIG. 7 depicts a sectional view through the completed semiconductor component according to the fifth example.

FIG. 7 shows a schematic view of a section through the finished optoelectronic semiconductor component 50 after joining the top molded body 1510 to the bottom molded body 1520. The shared molded bodies 1510, 1520 together form a shared molded body 1500 of the optoelectronic semiconductor component 50. The top surface 1511 of the top molded body 1510 forms a top surface 1501 of the shared molded body 1500. The bottom surface 1522 of the bottom molded body 1520 forms a bottom surface 1502 of the shared molded body 1500.

The top molded body 1510 and the bottom molded body 1520 connect to each other such that the bottom surface 1102 of the thin-film chip 1500 is in good thermal contact with the top surface 4201 of the insulating plate 4200. At the same time, the wiring structure 2310 arranged on the top surface 4201 of the insulating plate 4200 electrically contacts the electrical contact 1111 at the bottom surface of the thin-film chip 1100, thus forming an electrical connection between the first electrical contact pad 410 via the first bottom conductor structure 2300 and the wiring structure 1310 to the electrical contact of the thin-film chip 1100. The top molded body 1510 and the bottom molded body 1520 are furthermore connected such that the conductive connection 2365 generates an electrically conductive connection between the second bottom conductor structure 2355 and the top conductor structure 2350.

Upon joining the molded bodies 1510, 1520 to form the shared molded body 1500, an electrically conductive connection has been generated between the end of the top conductor structure 2350 positioned on the top surface 1501 of the shared molded body 1500 and the bond pad 1121 at the top surface of the thin-film chip 1100. Thus, an electrical connection exists between the second electrical contact pad 420 to the bond pad 1121 of the thin-film chip 1100 via the second bottom conductor structure 2355, the conductive connection 2365, the top conductor structure 2350 and the bond wire 2360.

Subsequently, a luminescent layer 600 has again been arranged on the top surface 1510, into which the bond wire 2360 has been embedded. Again, the luminescent layer 600 may be omitted.

Preferably, a plurality of thin-film chips 1100 is embedded into the top molded body 1510. Moreover, a plurality of insulating plates has preferably been embedded into the bottom molded body 1520. Subsequently, the two molded bodies 1510, 1520 have preferably been joined with the shared molded body 1500 such that a plurality of optoelectronic semiconductor components 50 has been formed. Only then have the optoelectronic semiconductor components 50 been separated from each other by cutting up the shared molded body 1500.

Our components and methods have been described in detail in conjunction with preferred examples. However, this disclosure is not limited to the disclosed examples. Rather, those skilled in the art may devise other variants therefrom without exceeding the scope of the disclosure.

The invention claimed is:

1. An optoelectronic semiconductor component comprising:
   an optoelectronic thin-film chip; and
   a thermally conductive and electrically insulating element, wherein
   both the thin-film chip and the element are embedded in a molded body,
   a top surface of the thin-film chip and a bottom surface of the element are not covered by the molded body,
   the top surface of the thin-film chip is approximately flush with a top surface of the molded body,
   the bottom surface of the element is approximately flush with a bottom surface of the molded body,
   the molded body comprises a first embedded conductor structure and a second embedded conductor structure,
   the first conductor structure and the second conductor structure extend to the bottom surface of the molded body, and the thin-film chip comprises electrical bond pads arranged on its top surface, each bond pad connected to one of the conductor structures via one bond wire, respectively.

2. The optoelectronic semiconductor component of claim 1, further comprising a solderable thermal contact pad being arranged at the bottom surface of the element.

3. The optoelectronic semiconductor component of claim 1, further comprising two solderable electric contact pads electrically conductively arranged at the bottom surface of the semiconductor component and connected to the embedded conductor structures.

4. The optoelectronic semiconductor component of claim 1, wherein the element is configured as a ceramic plate.

5. The optoelectronic semiconductor component of claim 4, wherein the element has an electrical through contact.

6. The optoelectronic semiconductor component of claim 4, wherein the thin-film chip comprises an electrical contact arranged on its bottom surface,
- an electrically conductive layer is arranged on a top surface of the element, the electrically conductive layer electrically conductively connects to the contact, and
- the electrically conductive layer electrically conductively connects to one of the conductor structures.

7. The optoelectronic semiconductor component of claim 6, wherein the electrically conductive layer connects to one of the conductor structures by a bond wire embedded in the molded body.

8. The optoelectronic semiconductor component according to claim 1, wherein the thin-film chip and the element thermally conductively abut each other.

9. An optoelectronic semiconductor component comprising:
- an optoelectronic thin-film chip; and
- a thermally conductive and electrically insulating element, wherein
- both the thin-film chip and the element are embedded in a molded body,
- a top surface of the thin-film chip and a bottom surface of the element are not covered by the molded body,
- the top surface of the thin-film chip is approximately flush with a top surface of the molded body,
- the bottom surface of the element is approximately flush with a bottom surface of the molded body,
- the molded body comprises a first embedded conductor structure and a second embedded conductor structure,
- the first conductor structure and the second conductor structure extend to the bottom surface of the molded body,
- the element is configured as a ceramic plate,
- the thin-film chip comprises an electrical contact arranged on its bottom surface,
- an electrically conductive layer is arranged on a top surface of the element, the electrically conductive layer electrically conductively connects to the contact, and
- the electrically conductive layer electrically conductively connects to one of the conductor structures.

10. The optoelectronic semiconductor component of claim 9, further comprising a solderable thermal contact pad being arranged at the bottom surface of the element.

11. The optoelectronic semiconductor component of claim 9, further comprising two solderable electric contact pads electrically conductively arranged at the bottom surface of the semiconductor component and connected to the embedded conductor structures.

12. The optoelectronic semiconductor component of claim 9, wherein the thin-film chip comprises electrical bond pads arranged on its top surface, each bond pad connected to one of the conductor structures via one bond wire, respectively.

13. The optoelectronic semiconductor component of claim 9, wherein the element has an electrical through contact.

14. The optoelectronic semiconductor component of claim 9, wherein the electrically conductive layer connects to one of the conductor structures by a bond wire embedded in the molded body.

15. The optoelectronic semiconductor component according to claim 9, wherein the thin-film chip and the element thermally conductively abut each other.

* * * * *